(12) United States Patent
Friend et al.

(10) Patent No.: US 6,437,602 B1
(45) Date of Patent: Aug. 20, 2002

(54) FULLY DYNAMIC LOGIC NETWORK CIRCUITS

(75) Inventors: David M. Friend; Nghia Van Phan, both of Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/904,040

(22) Filed: Jul. 12, 2001

(51) Int. Cl.[7] ............................................... H03K 19/96
(52) U.S. Cl. .............................. 326/93; 326/95; 326/98; 326/121; 327/208
(58) Field of Search ............................ 326/93, 95, 98, 326/121; 327/208–212, 214, 215, 224, 225

(56) References Cited

U.S. PATENT DOCUMENTS 6,046,606 A * 4/2000 Chu et al. ...................... 326/95
6,104,212 A * 8/2000 Curran ........................... 326/95
6,163,173 A * 12/2000 Storino et al. ................ 326/98

* cited by examiner

*Primary Examiner*—Michael Tokar
(74) *Attorney, Agent, or Firm*—Bracewell & Patterson,L.L.P.

(57) ABSTRACT

A fully dynamic logic network and method of operation thereof. The dynamic logic network includes a number of dynamic switching circuits, where each of dynamic switching circuits generates an output signal. In an advantageous embodiment, each of the dynamic switching circuits is a dynamic domino gate. The dynamic logic network also includes a dynamic logic circuit that is coupled to the dynamic switching circuits. The dynamic logic circuit, in turn, includes a clock generation circuit and a logic switching circuit that in a preferred embodiment is a dynamic NOR, or alternatively, NAND gate. The clock generation circuit receives the output signals from the dynamic switching circuits and generates, in response thereto, a control signal. The logic switching circuit also receives the output signals from the dynamic switching circuits and generates a logic output signal in response to a state of the control signal generated by the clock generation circuit.

17 Claims, 4 Drawing Sheets

FULLY DYNAMIC LOGIC NETWORK CIRCUITS

BACKGROUND OF THE INVENTION

1. Technical Field

The present invention relates in general to logic circuits and, in particular, to dynamic logic circuits. More particularly, the present invention relates to a fully dynamic logic network that utilizes a dynamic logic circuit, such as a dynamic NAND or a dynamic NOR gate, in conjunction with dynamic switching circuits such as dynamic domino logic gates.

2. Description of the Related Art

Integrated complementary metal-oxide-semiconductor (CMOS) logic circuits typically come in two types; static and dynamic field effect transistor (FET) logic gates. A static logic gate generally does not require an external clock signal to control its operation. Furthermore, the static logic gate can maintain its state for as long as a supply voltage is applied to it. A dynamic logic gate, on the other hand, generally does not hold its state indefinitely and requires an external clock signal to operate the circuit, e.g., in a precharge and evaluation mode. Dynamic CMOS logic gates, in contrast to static gates, generally tend to yield better performance, consume less power and typically require less silicon area for fabrication.

Dynamic switching circuits are designed to operate in two phases, a precharged phase and an evaluate phase. During the precharge phase, nodes within the dynamic circuit are set to predefined voltage levels. During the evaluate phase, the dynamic circuit nodes switch from their precharge state depending on the logic function of the dynamic switching circuit. Dynamic switching circuits are often cascaded together such that the output of one dynamic circuit becomes the input to the logic function of a second dynamic circuit. Each dynamic circuit is precharged in parallel, i.e., at the same time. However, each dynamic circuit evaluates in series. Dynamic circuits cascaded in this fashion are sometimes referred to as domino circuits in that the precharge sets up each dynamic circuit and a first dynamic circuit evaluation sets off a series of evaluations in each succeeding dynamic circuit until a final output is received.

A conventional dynamic domino circuit typically comprises a logic evaluation, or combinational logic, circuit that implements the desired logic function followed by a negative logic gate. A negative logic gate is necessary because the domino CMOS gates are generally non-inverting and generally do not provide a universal set of logic elements. However, they are compatible with CMOS static gates. Consequently, most logic functions can be implemented with domino CMOS alone or in combination with static negative logic gates which may be either a NOR, NAND or INVERTER gate. Since the performance of any given digital circuit design generally depends on the number of logic states in the critical paths and the delays at each stage, the utilization of the static NAND or static NOR gates are preferred over the static INVERTER in many applications. Static NAND and NOR gates allow for so-called complex-domino gates, in which the outputs of two or more dynamic structures are logically combined in the static gate. This allows for larger, more complex logic functions than the standard domino circuits would otherwise allow for. Additionally, the static NAND and NOR gates also provide an opportunity to split wide dynamic "trees," thus improving noise margins. However, when utilized to drive "heavy" loads, the static NAND and NOR gates typically suffer performance degradation faster than static inverter gates.

Accordingly, what is needed in the art is an improved switching logic network topology that mitigates the limitations discussed above. More particularly, what is needed in the art is a fully dynamic switching network that allows the utilization of NAND and NOR gates without incurring the penalty of faster performance degradation under heavy load conditions.

SUMMARY OF THE INVENTION

To address the above-discussed deficiencies of the prior art, the present invention provides a fully dynamic logic network. In one embodiment, the dynamic logic network includes a number of dynamic switching circuits, where each of dynamic switching circuits generates an output signal. In an advantageous embodiment, each of the dynamic switching circuits is a dynamic domino gate. The dynamic logic network also includes a dynamic logic circuit that is coupled to the dynamic switching circuits. The dynamic logic circuit, in turn, includes a clock generation circuit and a logic switching circuit that in a preferred embodiment is a dynamic NOR, or alternatively, a NAND gate. The clock generation circuit receives the output signals from the dynamic switching circuits and generates, in response thereto, a control signal. The logic switching circuit also receives the output signals from the dynamic switching circuits and generates a logic output signal in response to a state of the control signal generated by the clock generation circuit.

The present invention discloses a novel fully dynamic logic switching network that utilizes a dynamic logic gate, such as a dynamic NAND or NOR gate, in place of the static gates presently employed in conventional circuits. The driveability problem inherent in static NAND and NOR logic gates are substantially obviated allowing the utilization of NAND and NOR logic gates in dynamic circuits that are driving heavy loads. Furthermore, since the output stage of the dynamic logic switching network of the present invention are dynamic in nature, its performance is superior to the conventional dynamic circuits utilizing static logic gates at their output stage. This is due to the reduced capacitance seen on the precharge nodes of the dynamic switching circuits resulting from the smaller device sizes required for the transistors in the dynamic logic gate as opposed to transistors required for a static logic gate.

The foregoing description has outlined, rather broadly, preferred and alternative features of the present invention so that those skilled in the art may better understand the detailed description of the invention that follows. Additional features of the invention will be described hereinafter that form the subject matter of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest

BRIEF DESCRIPTION OF THE DRAWINGS

The novel features believed characteristic of the invention are set forth in the appended claims. The invention itself however, as well as a preferred mode of use, implementing a logical operation further objects and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
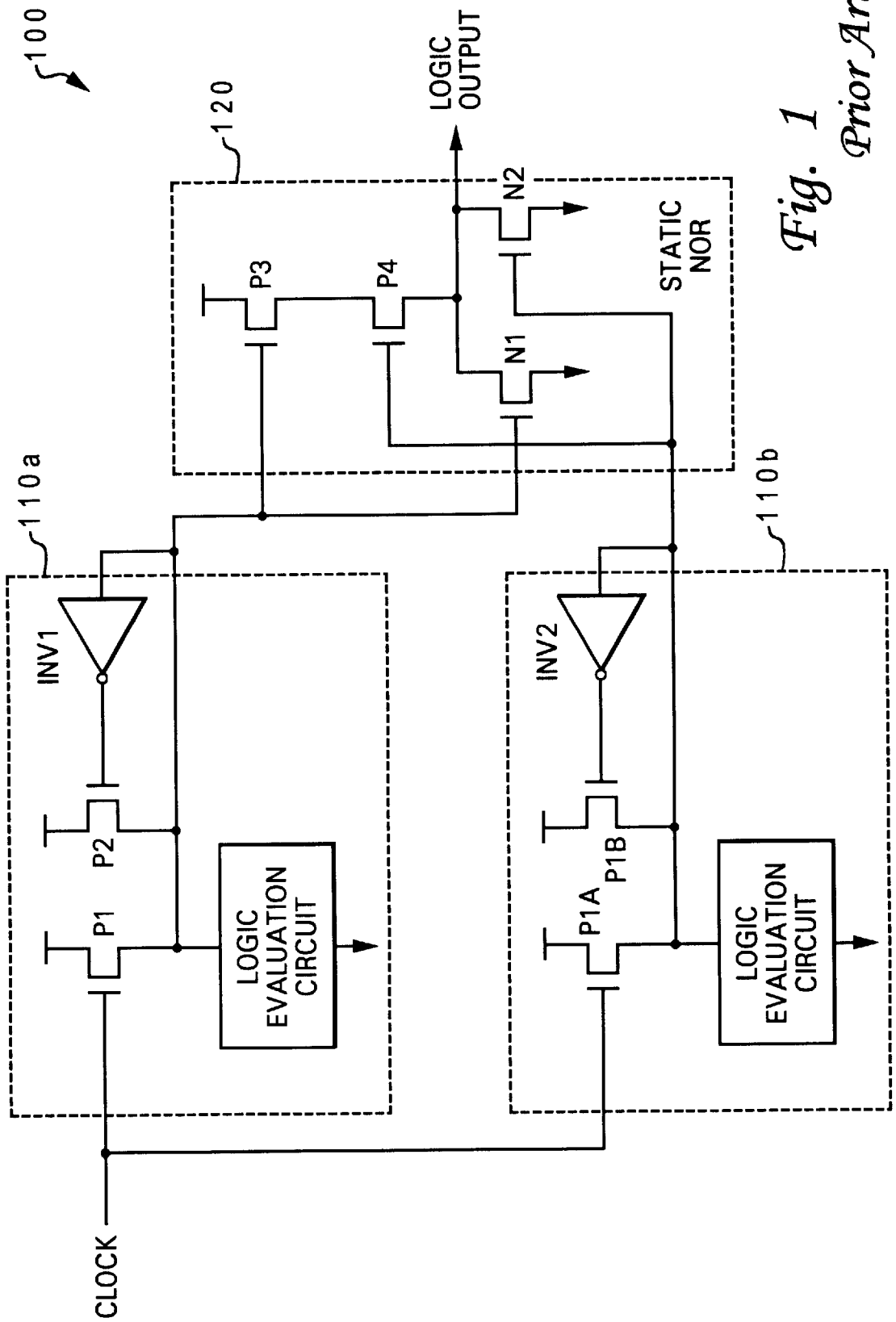
FIG. 1 illustrates a schematic diagram of an exemplary dynamic domino circuit utilizing a static NOR output gate.
Figure 2:
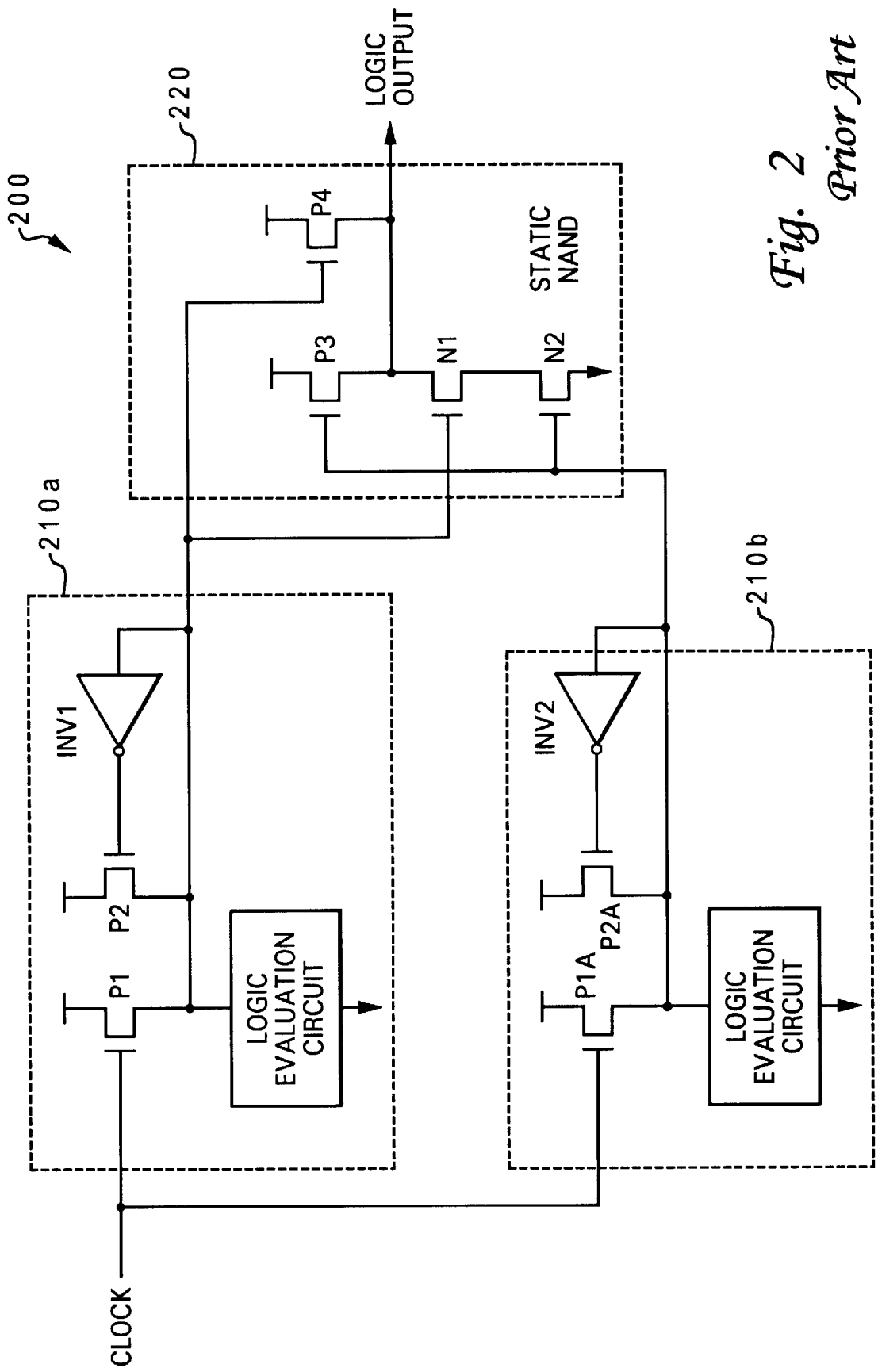
FIG. 2 illustrates a schematic diagram of an exemplary dynamic domino circuit utilizing a static NAND output gate.

With reference now to the FIGURES and in particular with reference to FIGS. 1 and 2, there are depicted schematic diagrams of exemplary dynamic domino circuits 100, 200 with NOR and NAND static output gates 120, 220, respectively. Each of dynamic circuits 100, 200 typically include a precharge transistor, e.g., PFET P1 or PFET P1A, that are coupled to a clock signal. Additionally, an evaluate transistor (not shown), such as a n-channel field effect transistor (NFET) device, is also coupled to the clock signal. The clock signal controls the operation of the evaluate and precharge transistors in a complementary manner, wherein in a precharge phase, the precharge transistor is turned ON and the evaluate transistor is turned OFF. Conversely, in an evaluate phase, the precharge transistor is turned OFF and the evaluate transistor is turned ON. Following a computation, the precharge transistor resets the state of a dynamic node in the dynamic circuit and forces the output voltage low in preparation for a subsequent computation. The evaluate transistor prevents the dynamic node from being discharged prematurely and prevents a direct path from a supply voltage (not shown) to ground during the precharge operation. A half-latch p-channel field effect transistor (PFET), i.e., P2 or P1B, is coupled to the dynamic node and a buffer INV1 and is utilized to hold the dynamic node high, and thereby the output low, for conditions in which the precharge transistor is OFF and there is no open path from the dynamic node to ground.

As discussed previously, since domino CMOS gates are non-inverting, i.e., dynamic logic is inherently negative logic, they do not provide a universal set of logic elements. The CMOS gates, however, are input-output compatible with CMOS static gates. Thus, each domino dynamic gate generally ends with a negative static gate, such as an inverter, NOR or NAND gate. Furthermore, since the performance of any given digital circuit design is dependent on the number of logic states in the critical paths and the delays at each stage, the utilization of the static NAND or static NOR gates are preferred over the static inverter in many applications. The present invention recognizes that the static NAND and especially the static NOR gates suffer from performance degradation faster than the static inverter when utilized to drive "heavy" loads. The present invention mitigates this "driveability" problem inherent with static NAND and NOR gates by replacing the static gates with dynamic gates to make the dynamic domino circuit a fully dynamic circuit.

Figure 3:
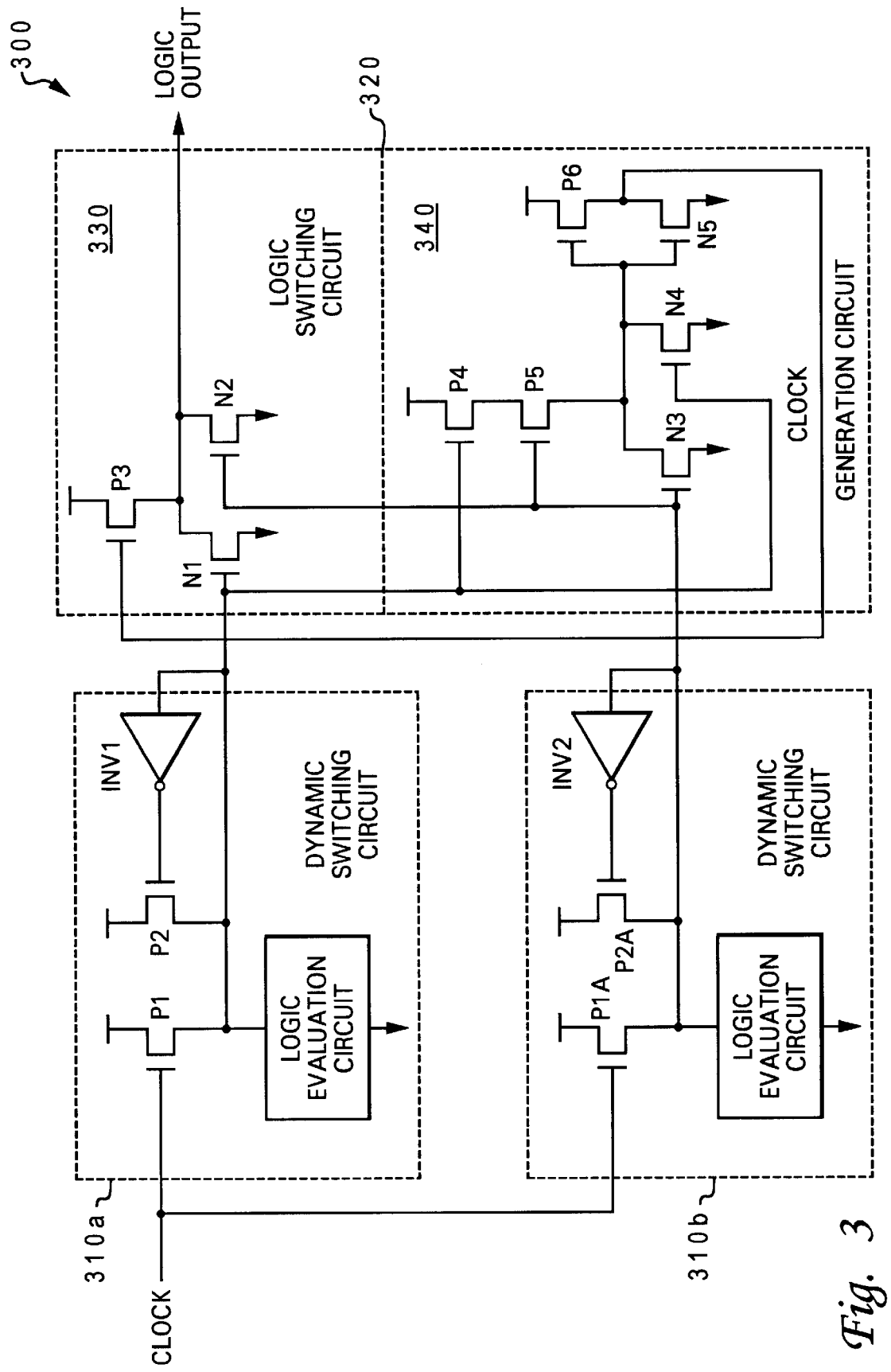
FIG. 3 illustrates a simplified schematic diagram of an embodiment of a dynamic logic network utilizing a dynamic NOR gate according to the present invention.

Referring now to FIG. 3, there is depicted a simplified schematic diagram of an embodiment of a dynamic logic network 300 utilizing a dynamic NOR gate 320 according to the present invention. Dynamic logic network 300 includes first and second switching circuits 310a, 310b coupled to a two-input dynamic NOR logic circuit 320. It should be noted that although two switching circuits are shown in the illustrated embodiment, it should be readily apparent to those skilled in the art that the present invention is not limited to only two switching circuits. The present invention can be advantageously practiced with any number of switching circuits coupled to a dynamic logic circuit with an equal number of inputs. First switching circuit 310a, and similarly second switching circuit 310b, includes a first transistor P1 (a PFET device is shown) coupled to a clock signal. As discussed in greater detail above, first transistor P1 functions as a precharge transistor and is coupled to a logic evaluation circuit that is typically a NFET-logic network and is utilized to implement the desired logical operation. First switching circuit 310a also includes an inverter INV that buffers the output of first switching circuit 310a and a half-latch P2 coupled to a dynamic node of the logic evaluation circuit.

Dynamic NOR gate 320 includes a logic switching circuit 330 and a clock generation circuit 340. Clock generation circuit 340 includes a stacked pair of transistors, i.e., fourth and fifth PFETs P4, P5, coupled in series with parallel-coupled third and fourth NFETs N3, N4. The output signals from first and second dynamic switching circuits 310a, 310b control the switching operation of fourth NFET N4 and fourth PFET P4; and third NFET N3 and fifth PFET P5, respectively. Clock generation circuit 340 also includes fifth NFET N5 and sixth PFET P6, configured as an inverter. The output of the inverter is a control signal, i.e., "clock" signal, that is provided to logic switching circuit 330.

Generally, logic switching circuit 330 implements the logic function of dynamic NOR gate 320 and includes first and second NFETs N1, N2 that are coupled in a parallel configuration where the operation of first and second NFETs N1, N2 are controlled by the outputs of first and second switching circuits 310a, 310b, respectively. It should be readily apparent to those skilled in the art that the number of NFETs that are parallel-coupled can be extended to any additional number depending on the number output signals from the dynamic switching circuits. A third PFET P3 is coupled in series with first and second NFETs N1, N2 and is operationally controlled by the control signal generated by clock generation circuit 340. Logic switching circuit 330 receives the output signals from first and second dynamic switching circuits 310a, 310b and generates a logic output signal in response to a state of the control signal from clock generation circuit 320. The logic output signal is the inverse of the logical result from boolean ORing the output signals from first and second dynamic switching circuits 310a, 310b.

When both first and second dynamic switching circuits 310a, 310b evaluate to "0," the logic output of dynamic logic network 300 should transition high. If a static NOR gate is utilized at the output stage, the output node would be pulled up with two stacked PFET devices. Under conditions of large loads or long "wires," this will result in long transition times and slow delays, even if large PFET devices are utilized. Clock generation circuit 340 mimics the logic of the static NOR gate, but under very small load conditions. Thus, the switching devices employed in clock generation circuit 340 can be made small and very fast. The output of clock generation circuit 340, i.e., control signal, is then utilized to control the single PFET pullup, i.e., third PFET P3, in logic switching circuit 330 that is much more efficient at driving large loads. It should be noted that the addition of a delay in clock generation circuit 340 will be more than compensated for in the increased performance of logic switching circuit 330.

Figure 4:
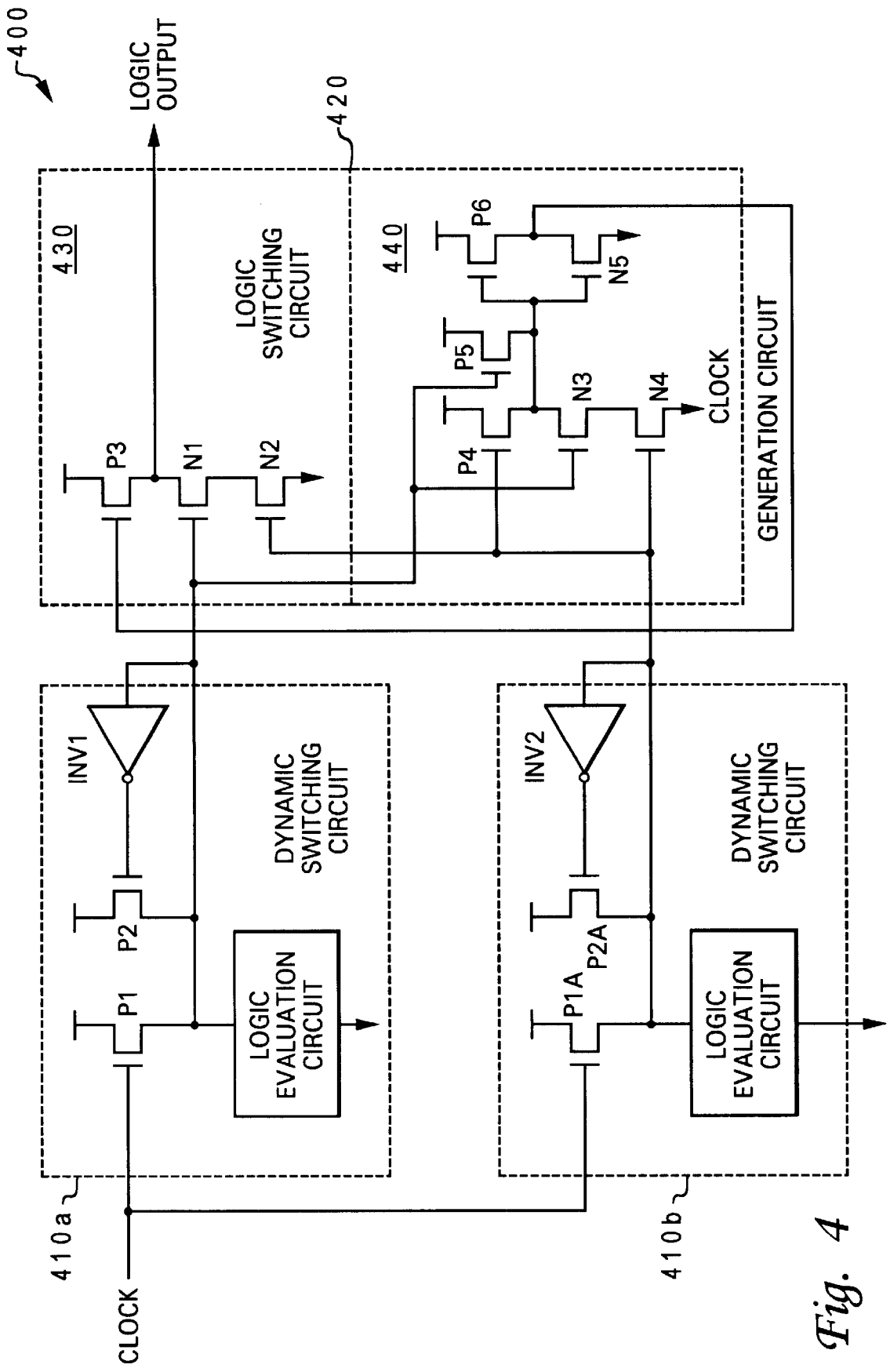
FIG. 4 illustrates a simplified schematic diagram of an embodiment of a dynamic logic network utilizing a dynamic NAND gate according to the present invention.

Referring now to FIG. 4, there is illustrated a simplified schematic diagram of an embodiment of a dynamic logic network 400 utilizing a dynamic NAND gate 420 according to the present invention. Dynamic logic network 400 includes first and second dynamic switching circuits 410a, 410b coupled to dynamic NAND gate 420. First and second dynamic switching circuits 410a, 410b are analogous in construction and function to first and second dynamic switching circuits 310a, 310b depicted in FIG. 3 and thus will not be described hereinafter in greater detail. Dynamic NAND gate 420 includes a clock generation circuit 440 that receives the output signals generated by first and second dynamic switching circuits 410a, 410b and generates, in turn, a control, or "clock," signal. Dynamic NAND gate 420 also includes a logic switching circuit 430 that also receives the output signals generated by first and second dynamic switching circuits 410a, 410b and in response to a state of the control signal from clock generation circuit 440, produces a logic output signal. The logic output signal is the inverse of the logical result from boolean ANDing the output signals from first and second dynamic switching circuits 410a, 410b.

Logic switching circuit includes first and second NFETs N1, N2 and third PFET P3 in a stacked configuration. First and second NFETs N1, N2 are controlled by the output signals generated by first and second dynamic circuits 410a, 410b, respectively, while the operation of third PFET P3 is controlled by the control signal generated by clock generation circuit 440. As shown in the illustrated embodiment, the logic output signal is derived from a node between first NFET N1 and third PFET P3. Clock generation circuit 440 includes third and fourth NFETs N3, N4 that are series-coupled to a parallel-coupled pair of fourth and fifth PFETs P4, P5. As shown in FIG. 4, third NFET N3 and fifth PFET P5 are controlled by the output signal of first dynamic circuit 410a, while fourth NFET N4 and fourth PFET P4 are controlled by the output signal of second dynamic circuit 410b. Clock generation circuit 440 also includes fifth NFET N5 and sixth PFET P6, configured as an inverter. The output of the inverter is the control signal provided to logic switching circuit 430, specifically to selectively turn ON or OFF third PFET P3.

When either one of first and second dynamic switching circuits 410a, 410b evaluate to "0," the logic output of dynamic logic network 400 should transition high. Utilizing a static NAND gate at the output stage would require pulling up the output node with one of two large parallel PFET devices. Under conditions of large loads or long wires, this configuration works reasonably well. However, the use of large PFET devices will slow down the dynamic stages because of the large gate loads that these large PFET devices represent. Clock generation circuit 440 duplicates the logic in a static NAND gate but under very small load conditions. Therefore, the switching devices employed in clock generation circuit 440 can be made small and fast. The output, i.e., control signal, from clock generation circuit 440 is utilized to control the single PFET pull up device, i.e., third PFET P3. If the output loading of dynamic logic network 400 is sufficiently large, dynamic logic network 400 will outperform a conventional complex domino gate, such as domino circuit illustrated in FIG. 2, due to the reduction of loading in the dynamic stage.

Since the output stage of the dynamic logic switching network of the present invention is dynamic in nature, its performance is superior to the conventional dynamic circuits utilizing static logic gates at their output stage. This is due to the reduced capacitance seen on the precharge nodes of the dynamic switching circuits resulting from the smaller device sizes required for the transistors in the dynamic logic gate as opposed to transistors required for a static logic gate. Since only sixth PFET P6 and fourth NFET N4 are driving third PFET P3 (shown in FIGS. 3 and 4) and the precharge nodes in the dynamic switching circuits only have to drive the small first and second NFETs N1, N2 (illustrated in FIGS. 3 and 4), the size of the devices utilized for fourth, fifth and sixth PFETs P4, P5, P6 and third, fourth and fifth NFETs N3, N4, N5 can be reduced substantially. The elimination of the stacked PFET devices, i.e., third and fourth PFETs P3, P4, depicted in FIG. 2 as opposed to the single PFET, i.e., third PFET P3, utilized in dynamic logic network 400 and the reduction in shoot-through current resulting from employing dynamic circuits as opposed to static circuits also contribute in the reduction of the transistor sizes required.

While the invention has been particularly shown and described with reference to a preferred embodiment, it will be understood by those skilled in the art that various changes in form and detail may be made therein without departing from the spirit and scope of the invention.

What is claimed is:

1. A dynamic logic network, comprising:
   a plurality of dynamic switching circuits, each of said plurality of dynamic switching circuits having an output signal; and
   a dynamic logic circuit, coupled to said plurality of dynamic switching circuits, including:
      a clock generation circuit that receives said plurality of output signals and generates, in response thereto, a control signal; and
      a logic switching circuit, coupled to said clock generation circuit, that receives said plurality of output signals and generates a logic output signal in response to a state of said control signal.

2. The dynamic logic network as recited in claim 1, wherein each of said plurality of dynamic switching circuits is a dynamic domino gate.

3. The dynamic logic network as recited in claim 1, wherein said clock generation circuit includes a N-channel field effect transistor (NFET) and a P-channel field effect transistor (PFET) configured as an inverter.

4. The dynamic logic network as recited in claim 1, wherein said logic switching circuit is a dynamic NOR gate.

5. The dynamic logic network as recited in claim 4, wherein said logic switching circuit includes a plurality of parallel-coupled n-channel field effect transistors (NFETs) coupled in series with a p-channel field effect transistor (PFET), wherein each of said plurality of NFETs is controlled by a unique one of said plurality of output signals and said PFET is controlled by said control signal.

6. The dynamic logic network as recited in claim 4, wherein said clock generation circuit includes a plurality of parallel-coupled n-channel field effect transistors (NFETs) coupled in series with a plurality of series-coupled p-channel field effect transistors (PFETs), wherein each of said plurality of NFETs is controlled by a unique one of said plurality of output signals and each of said plurality of PFETs is controlled by a unique one of said plurality of output signals.

7. The dynamic logic network as recited in claim 1, wherein said logic switching circuit is a dynamic NAND gate.

8. The dynamic logic network as recited in claim 7, wherein said logic switching circuit includes a plurality of series-coupled n-channel field effect transistors (NFETs) coupled in series with a p-channel field effect transistor (PFET), wherein each of said plurality of NFETs is controlled by a unique one of said plurality of output signals and said PFET is controlled by said control signal.

9. The dynamic logic network as recited in claim 7, wherein said clock generation circuit includes a plurality of series-coupled n-channel field effect transistors (NFETs) coupled in series with a plurality of parallel-coupled p-channel field effect transistors (PFETs), wherein each of said plurality of NFETs is controlled by a unique one of said plurality of output signals and each of said plurality of PFETs is controlled by a unique one of said plurality of output signals.

10. A method for implementing a fully dynamic logic network having a plurality of dynamic switching circuits, wherein each of said plurality of dynamic switching circuits generates an output signal, comprising:

utilizing a dynamic logic circuit as an output stage for said plurality of dynamic switching circuits, said dynamic logic circuit:
generating a control signal in response to receiving said plurality of output signals;
implementing a logical operation with said plurality of output signals to produce a logic output signal; and
outputting said logic output signal in response to a state of said control signal.

11. The method as recited in claim 10, wherein each of said plurality of dynamic switching circuits is a dynamic domino gate.

12. The method as recited in claim 10, wherein said implementing a logical operation includes performing a boolean NOR operation.

13. The method as recited in claim 12, wherein said performing a boolean NOR operation includes utilizing a logic switching circuit having a plurality of parallel-coupled n-channel field effect transistors (NFETs) coupled in series with a p-channel field effect transistor (PFET), wherein each of said plurality of NFETs is controlled by a unique one of said plurality of output signals and said PFET is controlled by said control signal.

14. The method as recited in claim 12, wherein said generating a control signal includes utilizing a clock generation circuit having a plurality of parallel-coupled n-channel field effect transistors (NFETs) coupled in series with a plurality of series-coupled p-channel field effect transistors (PFETs), wherein each of said plurality of NFETs is controlled by a unique one of said plurality of output signals and each of said plurality of PFETs is controlled by a unique one of said plurality of output signals.

15. The method as recited in claim 10, wherein said implementing a logical operation includes performing a boolean NAND operation.

16. The method as recited in claim 15, wherein said performing a boolean NAND operation includes utilizing a logic switching circuit having a plurality of series-coupled n-channel field effect transistors (NFETs) coupled in series with a p-channel field effect transistor (PFET), wherein each of said plurality of NFETs is controlled by a unique one of said plurality of output signals and said PFET is controlled by said control signal.

17. The method as recited in claim 15, wherein said performing a boolean NAND operation includes utilizing a clock generation circuit having a plurality of series-coupled n-channel field effect transistors (NFETs) coupled in series with a plurality of parallel-coupled p-channel field effect transistors (PFETs), wherein each of said plurality of NFETs is controlled by a unique one of said plurality of output signals and each of said plurality of PFETs is controlled by a unique one of said plurality of output signals.

* * * * *